United States Patent [19]

Bahraman

[11] Patent Number: 5,001,528
[45] Date of Patent: Mar. 19, 1991

[54] RADIATION HARDENED CMOS ON SOI OR SOS DEVICES

[75] Inventor: Ali Bahraman, Palos Verdes Estates, Calif.

[73] Assignee: The United States of America as represented by the Secretary of the Air Force, Washington, D.C.

[21] Appl. No.: 304,759

[22] Filed: Jan. 31, 1989

[51] Int. Cl.[5] .................. H01L 27/01; H01L 27/12
[52] U.S. Cl. ........................................ 357/23.7; 357/4
[58] Field of Search .................. 357/23.7, 4, 42, 49, 357/23.11; 437/938

[56] References Cited

U.S. PATENT DOCUMENTS

| | | | |
|---|---|---|---|
| 4,053,916 | 10/1977 | Cricchi et al. | 357/23.7 |
| 4,484,209 | 11/1984 | Uchida | 357/23.7 |
| 4,489,339 | 12/1984 | Uchida | 357/23.7 |
| 4,809,056 | 2/1989 | Shirato et al. | 357/23.7 |
| 4,906,587 | 3/1990 | Blake | 357/23.7 |

*Primary Examiner*—Mark Prenty
*Attorney, Agent, or Firm*—Thomas L. Kundert; Donald J. Singer

[57] ABSTRACT

A radiation hardened CMOS transistor has a source region, drain region and channel region formed on an SOI or SOS wafer. End plugs of opposite conductivity to that of the source and drain regions are connected to the channel region. In one embodiment, the end plugs extend along opposite ends of the source region but not along the drain region. In another embodiment, the end plugs extend along opposite ends of the source region and the drain region, and the drain region includes portions adjacent the end plugs having an impurity concentration which is significantly lower than the impurity concentration of the remainder of the drain region. The transistor is surrounded by a silicon dioxide isolation region. Contact holes for establishing electrical contact are positioned over areas in which the source region interfaces with each of the end plugs, and over an area of the drain region. The end plugs are electrically tied to the source region through common metallized contacts so that radiation sensitive parasitic actions may be prevented.

6 Claims, 1 Drawing Sheet

RADIATION HARDENED CMOS ON SOI OR SOS DEVICES

RIGHTS OF THE GOVERNMENT

The United States Government has rights in this invention pursuant to Contract No. F19628-86-C-0074 between the U.S. Government and Northrop Corporation.

BACKGROUND OF THE INVENTION

The present invention is directed to semiconductor devices and particularly to CMOS SOI or SOS devices having radiation hardened characteristics.

Silicon-on-Insulator (SOI) technology has received considerably attention recently for development of high-density, radiation-hardened integrated circuits. The technology offers good potential for achieving a combination of radiation hardness and circuit density levels not attainable by bulk complementary metal oxide semiconductor (CMOS) or dielectrically isolated bipolar implementations. Interest in the technology has also been amplified by the recent availability of improved-quality oxygen-implanted SOI wafers. In particular, the SIMOX (Separation by IMplanted OXygen) approach is being considered as a production-capable process for providing high-quality SOI wafers. The following reference generally describes this technology. S. S. Tsao, D. M. Fleetwood, H. T. Weaver, L. Pfeiffer, and G. K. Cellar, "Radiation-Tolerant Sidewall-Hardened SOI/MOS Transistors," IEEE Trans. Nucl. Sci., Vol. NS-34, p. 1692, Dec. 87. This invention describes a fairly simple approach to development of radiation-hardened CMOS/SOI devices.

In CMOS/SOI radiation hardening, recent emphasis has mostly been on sidewall isolation, and two isolation approaches have been reported, The isolated mesa approach (with sloped sidewall) is an extension of device isolation techniques employed in CMOS/SOS where a MOS device is formed on a silicon layer on top of a sapphire substrate. Hardening of the sidewall in this case is implemented by using an appropriate hardened gate dielectric on the sidewall. There are some drawbacks with this approach: the sidewall transistor has different characteristics than the top channel transistor. The sidewall channel also connects the top channel to the back channel, which is not desirable due to potential corner effects: at the corners, the channel sees both the sidewall gate dielectric and the buried oxide. Even if the sidewall gate dielectric is hardened, buried oxide could cause radiation-inducted leakage at the two corners. Finally, the wafer topography is non-planar in this approach, and unless an effective planarization process is employed, it would have a low yield in metal definition.

Planarized polysilicon-filled trench isolation is another technique that has been applied for sidewall hardening. The sidewall hardness problem exists for oxide-isolated NMOS transistors because the channel along the sidewall can invert due to charge buildup in the isolation oxide. By using a polysilicon-filled trench in place of oxide isolation, the charge buildup problem can be reduced. However, this approach requires both the growth of a hardened gate oxide on the sidewall and a fairly difficult trench-definition-and-filling process, and these two requirements are not necessarily compatible. An important advantage of CMOS/SOI (or SOS) is its relative simplicity in device structure as compared to bulk CMOS. The addition of a difficult trench isolation process would detract from this advantage.

SUMMARY OF THE INVENTION

An object of the present invention is to provide a radiation hardened N or P type CMOS SOI or SOS transistor in which end plugs are formed at each end of a floating transistor body and are electrically connected through metallized contacts to a source region so that the body no longer floats. The body is electrically tied to the source region, thus preventing the formation of a bipolar transistor operation at the channel region which could be turned on by a $\gamma$ radiation pulse. Further, the end plugs separate the MOS sidewall from an isolation oxide, thereby solving a problem of radiation-induced turn-on of the sidewall transistor in a total dose environment.

A radiation hardened CMOS transistor according to the present invention comprises a source region, a drain region and a channel region formed on an SOI or SOS wafer. The conductivity of the source, drain and channel regions may be selected to form either an NMOS or PMOS type transistor. End plugs having a conductivity opposite that of the source region and drain region are connected to the channel region. The entire transistor is surrounded with a silicon dioxide isolation region. In one embodiment of the invention, the end plugs extend along opposite ends of the source region but not along the drain region, so as not to create a potential low breakdown voltage and excess leakage current condition between the drain and source.

In an alternate embodiment, the end plugs extend along opposite ends of the source region and the drain region, and the drain region includes portions adjacent the end plugs having an impurity concentration which is significantly lower than the impurity concentration of the remainder of the drain region.

Contract holes for establishing electrical contact with the transistor are positioned over areas in which the source region interfaces with each of the end plugs, and also over the area of the drain region.

Other features and advantages of the invention will be apparent from the following description and claims and are illustrated in the accompanying drawings.

DETAILED DESCRIPTION OF THE PREFERRED EMBODIMENTS

The present invention is a modification of the oxide-isolated NMOS (or PMOS) transistor formed on an SOI or SOS substrate, often referred to as the floating body transistor.

Figure 1:
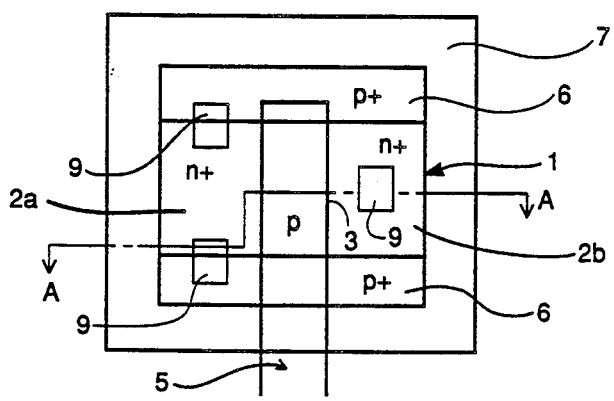
FIG. 1 is a top plan view of an N MOS transistor fabricated to the stage of contact hole placement and before metal deposition.
Figure 2:
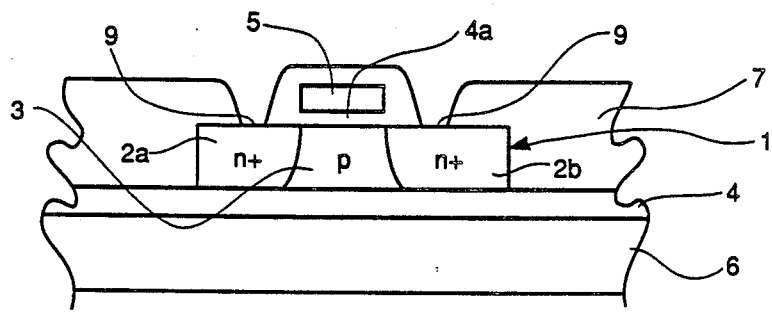
FIG. 2 is a cross sectional view of FIG. 1 taken along the lines A—A thereof.

As shown in FIGS. 1 and 2, the transistor of the present invention comprises a silicon island 1 formed on top of a buried oxide 4 on top of a silicon substrate 6. Source 2a and drain 2b regions of n+ conductivity are formed in the island, along with a channel region 3 of p conductivity which forms a transistor body. A gate oxide 4a is formed on top of the channel region 3, and a polysilicon gate 5 (or metal gate) is formed on top of the gate oxide 4a.

Silicon end plugs 6 of p+ conductivity are implanted at opposite ends of the silicon island 1, as shown in FIG. 1. A silicon dioxide isolation region 7 surrounds and covers the end plugs 6 and the silicon island 1. Each end plug 6 is connected to the channel region 3, and may also be connected to the source region 2a through contact holes 9, as shown in FIG. 1. An additional contact hole 9 is provided through the silicon dioxide isolation region 7 to drain region 2b. The contact holes 9 overlap the boundary between the source region 2a and the end plugs 6. Metal lines (not shown) may be laid over the contact holes 9 to provide electrical connection to source region 2a and drain region 2b, and to polysilicon gate 5 outside the area of the transistor. The metal lines may be made of aluminum, aluminum/silicon, or other metals. The end plugs 6 are electrically connected to the source region 2a, since the source region and end plugs have common contact holes 9 and metal lines. Since the end plugs 6 are connected to the channel region 3, the source region 2a is also electrically connected to the channel region 3.

The SOI wafer structure lends itself very well to a simple oxide isolation process with planar wafer topography for CMOS/SOI. The present invention uses this approach with a modified transistor layout design for solving sidewall and floating body radiation hardening problems. The width of the silicon island 1 along the channel region width is increased beyond the active transistor area in order to incorporate the two end plugs 6 which are doped for p+ for NMOS transistors (and n+ for PMOS transistors). As a result, the NMOS sidewall channel region no longer intersects the field oxide (silicon dioxide isolation region 7) and only highly doped p+ silicon regions of the end plugs are adjacent to the field oxide. Thus the problem of sidewall transistor radiation-induced turn-on is eliminated. The total dose radiation generates positive charge in the silicon dioxide isolation region 7. If the oxide were adjacent to the channel region sidewall, the induced positive charge buildup would invert the sidewall and cause sidewall leakage. The structure according to the invention prevents this problem.

Floating body MOS transistors exhibit an anomalous subthreshold slope behavior and the kink effect in the I-V characteristics. The kink effect can be minimized by using very thin, fully-depleted SOI films. There is also a parasitic bipolar transistor associated with the drain-body-source junctions of the MOS transistor. In an intense $\gamma$ environment, photocurrents in the drain-body and source-body biodes could cause the parasitic bipolar transistor to turn on and result in an upset in a memory circuit. These difficulties are eliminated in the present invention by electrically connecting the transistor body to the source region 2a, as herein described.

In the structure of FIG. 1 the end plugs 6 are connected to the channel region 3. Hence, the source is electrically connected, i.e., tied to the body, by the source metallization if the source region 2a and the end plugs 6 have common contact holes, such as illustrated by the contact holes 9 in FIG. 1. This eliminates the problem of a floating body which is inherent in the isolated mesa approach and in trench-isolation designs. In addition, since the source can be tied to the body in every transistor so that the problem of voltage-dependent variation of threshold voltage of a load transistor in analog MOS is greatly reduced, amplified linearity can be significantly improved.

In transmission gates, the body cannot be tied to the source, but is connected to a voltage rail. For this application, the end plugs 6 and the source region 2a cannot share the same contact holes, and a separate contact is required for the end plug to permit tying the body to $V_{SS}$ (or $V_{DD}$). This will consume extra area, however, transmission gates do not occur very often in random logic LSI, and the added area penalty should not be appreciable.

An important advantage of the hardening approach of the present invention is its simplicity and ease of fabrication. No special or complicated processing is needed. As mentioned previously, the source metallization automatically ties the source to the body, and both n+ and p+ processes are available in CMOS. Therefore, the end plugs can be incorporated without any increase in the number of masking steps. However, in order to independently control the impurity concentration in the NMOS end plugs, there is added an extra mask and a separate boron implantation step for that implantation. A satisfactory impurity range is now $10^{1}-10^{18}$ per cc.

Figure 3:
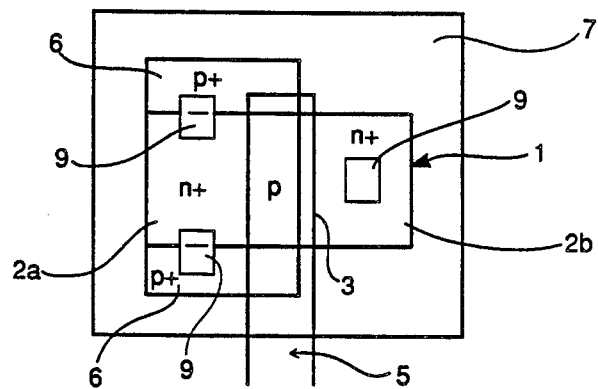
FIG. 3 is a top plan view of an NMOS transistor similar to that shown in FIG. 1 further illustrating a second modification of the layout for improving the drain-source breakdown voltage.

An apparent drawback of the structure of FIGS. 1 and 2 lies in the rather heavily-doped n+-n+ drain-to-body diodes that exist at the ends of the transistor. This results in a low drain-to-source breakdown voltage and excess drain-to-source leakage current. FIG. 3 shows a modified structure with shortened p+ end plugs 6 which do not contact with the drain region 2b. The end plugs 6 terminate inside the channel region 3, less than 1 mm from the edge of the drain region 2b. Thus, the drain n+-p+ diode is eliminated and the low breakdown voltage problem is removed. This structure will still be hard to total dose because a p-type channel does not exist next to the silicon dioxide isolation region 7. The embodiment of FIG. 3 has been implemented and has achieved low leakage currents, greatly improved breakdown voltage, and good radiation tolerance.

Figure 4:
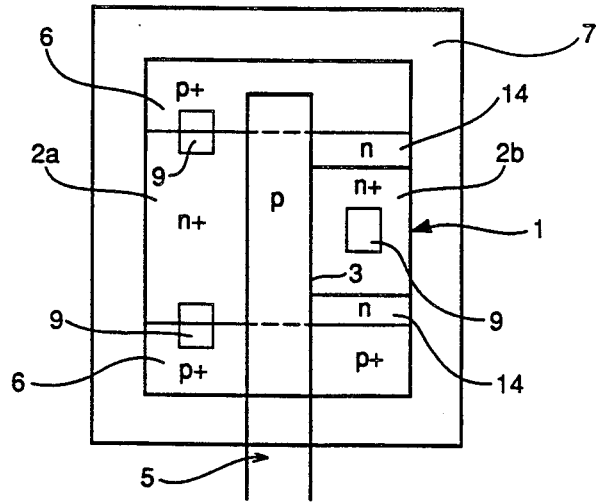
FIG. 4 is a top plan view of an N MOS transistor similar to that shown in FIG. 1 further illustrating a second modification of the layout for improving the drain-source breakdown voltage.

Another approach shown in FIG. 4 is to shorten the drain n+ implant mask by about 1 $\mu$m from the sidewall ends. The resulting transistor will then have an n region 14 between the n+ drain region 2b and the p+ end plugs 6, as illustrated in FIG. 4. This approach replaces the drain n+-p+ diode with a n+-n-p+ diode, having a very narrow n region. As a result, the breakdown voltage problem should be significantly improved.

The sidewall hardening approach of the present invention is consistent with achieving a high packing density and is comparable to the isolated mesa approach (with sloped sidewall). For the latter approach, layout design rules require that the polysilicon gate extend beyond the area of the active transistor island. The end plug width is only slightly larger than the poly gate extension. At the input side of the isolated mesa transistor, the poly gate must extend further if aluminum metal is to be tied to the poly gate. Again, layout rules require that the contact hole to the poly and the metal line be placed at at safe distance from the edge of the active region. In my invention, the edge of the metal line can coincide with the edge of the transistor channel, and the contact hole to the poly can be placed right on top of the end plug. For this case, the present design is better than the isolated mesa approach.

Finally, most of the chip area in random logic LSI/VLSI is taken by interconnects, and active devices consume a smaller fraction of the total chip area. Therefore, the total impact of adding the end plugs to chip size should be minimal.

Thus, while preferred features of the invention are embodied in the structure illustrated herein, it is understood that changes and variations may be made by those skilled in the art without departing from the spirit and scope of the invention.

What is claimed is:

1. A radiation hardened MOS SOI or SOS transistor comprising:
   a silicon-on-insulator or a silicon-on-sapphire wafer;
   a source region formed on said wafer;
   a drain region formed on said wafer;
   a channel region formed on said wafer between and contiguous with said source region and said drain region;
   said source region and said drain region being of one conductivity type and said channel being of an opposite conductivity type;
   end plugs connected to said channel region and extending along opposite ends of said source region but not along said drain region, said end plugs being of the same conductivity type as said channel region but of a higher impurity concentration, and said end plugs having a conductivity which is opposite to that of said source region; and
   means for establishing electrical contact with said drain region, said channel region, and with said source region and each of said end plugs.

2. The transistor of claim 1, further including a silicon dioxide isolation region surrounding said transistor.

3. The transistor of claim 1, wherein said source region, drain region, and channel region are of a conductivity type forming an NMOS transistor.

4. The transistor of claim 1, wherein said source region, drain region, and channel region are of a conductivity type forming a PMOS transistor.

5. The transistor of claim 1, further including a layer of buried oxide between said wafer and said source region, drain region and channel region.

6. The transistor of claim 1, wherein said end plugs are made of silicon.

* * * * *